(12) United States Patent
Ory

(10) Patent No.: US 11,289,391 B2
(45) Date of Patent: Mar. 29, 2022

(54) ELECTRONIC CHIP PACKAGE

(71) Applicant: STMICROELECTRONICS (TOURS) SAS, Tours (FR)

(72) Inventor: Olivier Ory, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 16/802,325

(22) Filed: Feb. 26, 2020

(65) Prior Publication Data

US 2020/0273767 A1 Aug. 27, 2020

(30) Foreign Application Priority Data

Feb. 27, 2019 (FR) ...................................... 1902000

(51) Int. Cl.
| | |
|---|---|
| *H01L 23/31* | (2006.01) |
| *H01L 21/3205* | (2006.01) |
| *H01L 21/56* | (2006.01) |
| *H01L 21/78* | (2006.01) |
| *H01L 29/861* | (2006.01) |

(52) U.S. Cl.
CPC .... *H01L 23/3114* (2013.01); *H01L 21/32051* (2013.01); *H01L 21/561* (2013.01); *H01L 21/78* (2013.01); *H01L 29/861* (2013.01)

(58) Field of Classification Search
CPC .......... H01L 23/3114; H01L 21/32051; H01L 21/561; H01L 21/78; H01L 29/861
USPC ........................................................ 257/603
See application file for complete search history.

(56) References Cited

U.S. PATENT DOCUMENTS

| | | | | |
|---|---|---|---|---|
| 6,423,570 | B1 * | 7/2002 | Ma ........................ | H01L 21/561 257/612 |
| 8,642,385 | B2 * | 2/2014 | Xue ........................ | H01L 24/05 438/113 |
| 8,963,314 | B2 * | 2/2015 | Pieraerts ............... | H01L 21/568 257/688 |
| 2008/0242052 | A1 * | 10/2008 | Feng ................... | H01L 21/3043 438/459 |
| 2009/0267230 | A1 | 10/2009 | Hwan | |
| 2011/0080897 | A1 | 7/2011 | Pieraerts et al. | |
| 2013/0037935 | A1 | 2/2013 | Xue et al. | |
| 2014/0070374 | A1 | 3/2014 | Numaguchi | |
| 2017/0358510 | A1 | 12/2017 | Park et al. | |
| 2018/0005912 | A1 | 1/2018 | Oh et al. | |
| 2018/0033694 | A1 | 2/2018 | Ueno et al. | |
| 2018/0102356 | A1 | 4/2018 | Ghorbanzadeh et al. | |

\* cited by examiner

*Primary Examiner* — Vu A Vu

(57) ABSTRACT

A device comprising a semiconductor substrate, an electrically-conductive layer covering the substrate, and an insulating sheath, the conductive layer being in contact with the insulating sheath on the side opposite to the substrate.

20 Claims, 5 Drawing Sheets

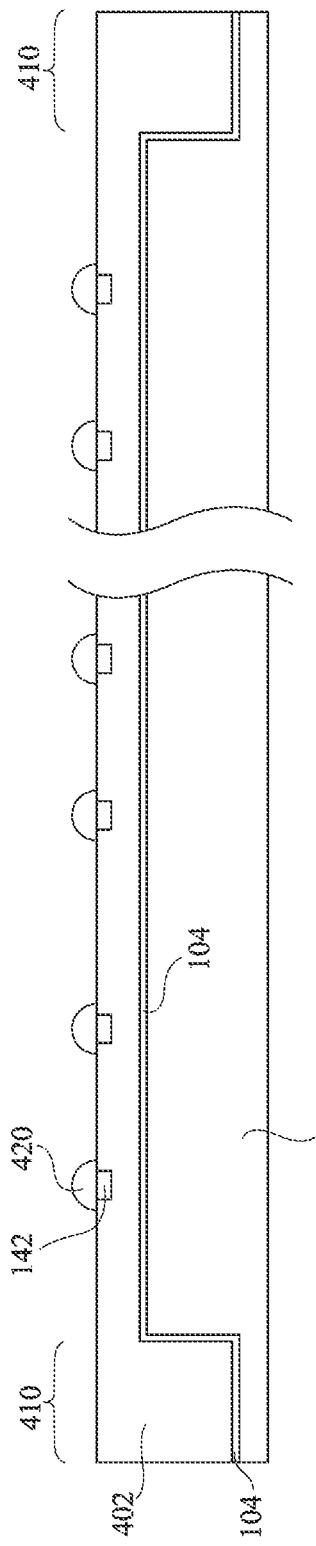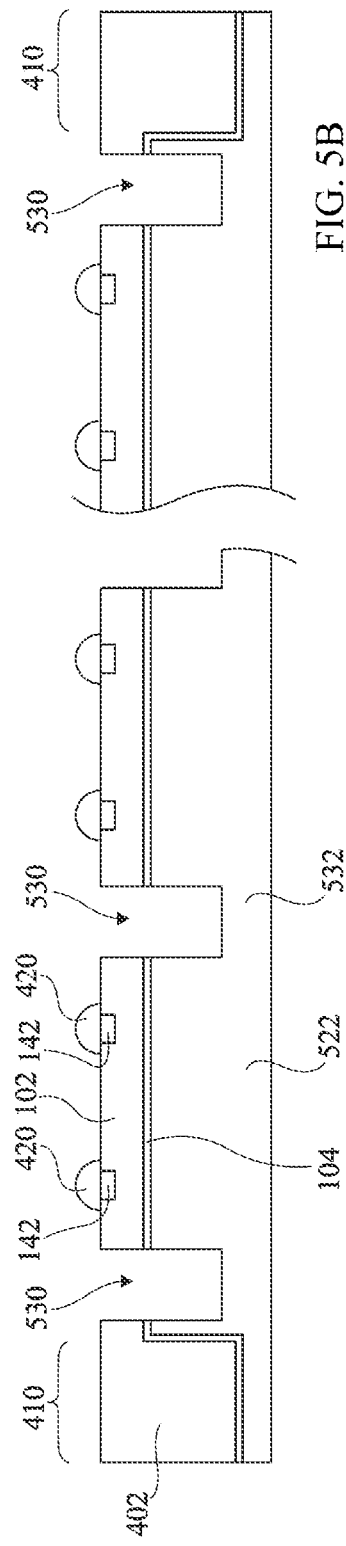

ELECTRONIC CHIP PACKAGE

BACKGROUND

Technical Field

The present disclosure generally relates to electronic devices and, more particularly, to an electronic device comprising an electronic chip.

Description of the Related Art

An electronic chip is generally defined by a semiconductor substrate inside and on top of which are located one or a plurality of interconnected components, such as diodes and transistors, forming circuits of the chip. In certain applications, such as electrostatic discharge protection, the chip comprises an avalanche diode.

Typically, a chip is housed in a package. The package comprises connection terminals, generally intended to be welded or soldered to a printed circuit such as a PCB ("printed circuit board"). For a device comprising an electronic chip housed in a package to be compact, a CSP-type package ("chip scale package"), that is, occupying a small surface area, typically smaller than 1.2 times that of the chip substrate, is often used.

BRIEF SUMMARY

An embodiment overcomes all or part of the disadvantages of known electronic chip packages.

An embodiment overcomes all or part of the disadvantages of devices comprising an electronic chip in a package.

Thus, an embodiment provides a device comprising a semiconductor substrate, an electrically-conductive layer covering the substrate, and an insulating sheath, the conductive layer being in contact with the insulating sheath on the side opposite to the substrate.

According to an embodiment, the conductive layer is covered, on the side opposite to the substrate, with a single insulating material.

According to an embodiment, the device comprises the electronic components located inside and on top of the substrate.

According to an embodiment, the electronic components are located on the side of the substrate opposite to the conductive layer.

According to an embodiment, the conductive layer is metallic.

According to an embodiment, the substrate comprises a doped area defining an electrode of an avalanche diode.

According to an embodiment, the sheath defines a CSP-type package.

An embodiment provides a method comprising a step of manufacturing of a device as described.

According to an embodiment, the method comprises a step of simultaneously forming a plurality of devices as described above.

According to an embodiment, the substrates of the devices are portions of a central portion of a same semiconductor wafer.

According to an embodiment, the method comprises a step of thinning said central portion while keeping the thickness of a peripheral portion of the semiconductor wafer.

According to an embodiment, the method comprises a step of forming, on a back side of the semiconductor wafer, a layer defining the conductive layers of the devices.

According to an embodiment, the method comprises a step of forming a layer made of said insulating material covering said layer defining the conductive layers of the devices.

According to an embodiment, the method comprises a step of forming trenches delimiting the substrates of the devices.

According to an embodiment, the method comprises a step of filling the trenches with an insulating material.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIGS. 5A-5B show, in partial simplified cross-section views, other steps of implementation of the method of simultaneously forming a plurality of devices of FIG. 1;

DETAILED DESCRIPTION

Figure 1:
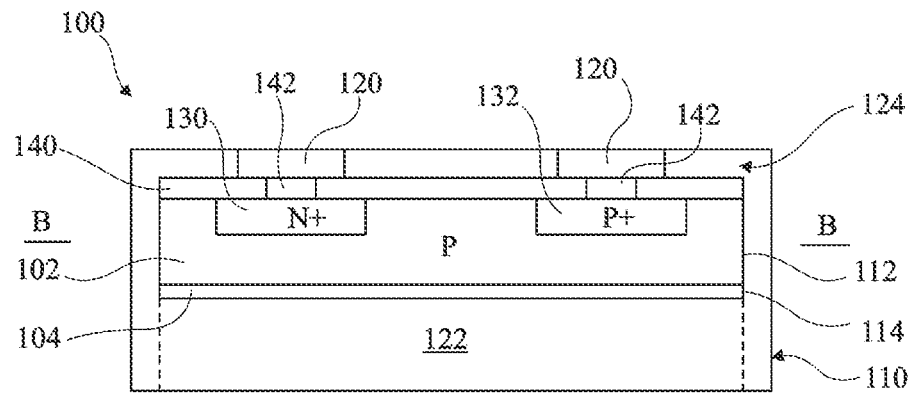
FIG. 1 is a cross-section view schematically showing an embodiment of a device comprising an electronic chip in a package.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, electronic chip circuits are not shown, the described embodiments being compatible with usual chip circuits.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

Figure 2:
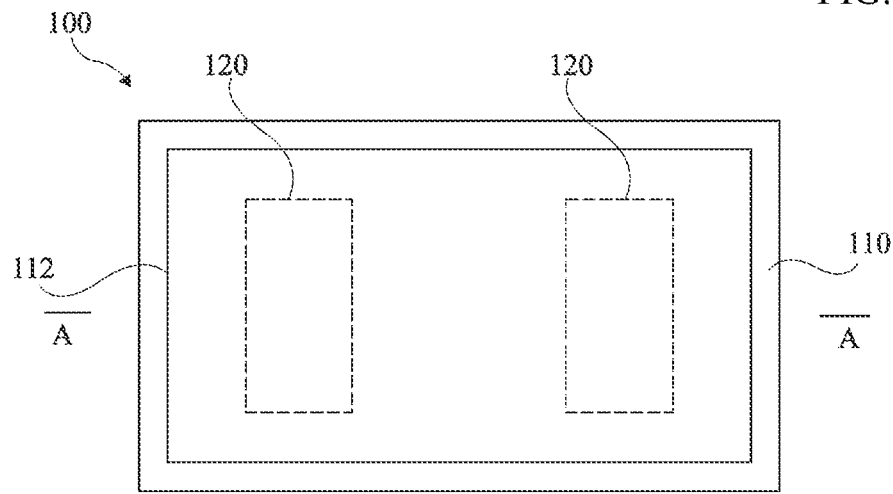
FIG. 2 is another cross-section view schematically showing the package of FIG. 1.

FIGS. 1 and 2 are cross-section views schematically showing an embodiment of a device 100 comprising an electronic chip in a package. FIG. 1 is a cross-section view along a plane A-A shown in FIG. 2, and FIG. 2 is a cross-section view along a plane B-B shown in FIG. 1.

Device 100 comprises a substrate 102. The substrate has a front side (upper surface) and a back side (lower surface). Substrate 102 is an electronic chip substrate, that is, inside and on top of which are located one or a plurality of electronic chip circuit components. The electronic components are preferably located on the front side of substrate 102 inside and on top of substrate 102. Substrate 102 is semiconductor, preferably made of silicon. Substrate 102 is preferably a thin substrate, for example, having a thickness smaller than approximately 150 µm or smaller than 150 µm, preferably smaller than approximately 100 µm or smaller than 100 µm.

The back side of substrate 102 is covered with an electrically-conductive layer 104. Layer 104 is preferably metallic and comprises, for example, aluminum and/or nickel and/or gold (for example AlNiAu) and/or eutectic gold and/or copper and/or titanium (for example TiNiAu). Layer 104 covers the back side of substrate 102, preferably integrally. Layer 104 is preferably a continuous layer, that is, comprising no through openings.

Preferably, conductive layer 104 and substrate 102 are stacked so that their edges coincide. The assembly of conductive layer 104 and of substrate 102 preferably has the shape of a parallelepiped.

Device 100 further comprises an electrically-insulating sheath 110 which coats the assembly of conductive layer 104 and of substrate 102, that is, sheath 110 covers the front side of substrate 102, the back side of conductive layer 104, and sides 112 and 114 respectively of substrate 102 and of conductive layer 104.

Sheath 110 is in contact with conductive layer 104. More particularly, the contact between conductive layer 104 and sheath 110 is direct or only via a possible layer resulting from an exposure of layer 104 to air during the manufacturing process. Such a layer resulting from an exposure to air typically has a thickness smaller than 10 nm and is typically a layer of an oxide of one or a plurality of elements, for example, metallic, comprised within layer 104. The sheath is preferably in adhesive contact with sides 112 and 114, and with the respective front and back sides of the substrate 102 and of conductive layer 104. Preferably, sheath 110 integrally covers the back side of layer 104 and sides 112 and 114. More particularly, sheath 110 comprises no opening on sides 112 and 114 and on the back side of layer 104. Preferably, the portion of the sheath which covers the front side of substrate 102 is crossed by connection terminals 120. Preferably, sheath 110 integrally covers all the surfaces of the assembly of the substrate and of conductive layer 104, except for connection terminals 120. Sheath 110 thus defines an electronic chip package. The external surfaces of sheath 110 form the outer surfaces of the package. The package is preferably of CSP type.

Preferably, sheath 110 comprises a region 122 which covers the back side of conductive layer 104 (that is, located under layer 104 in the orientation of FIG. 1) and a region 124 which covers the front side of substrate 102, sides 112 and 114, and the sides of region 122. Region 122 extends from layer 104 to the back side of sheath 110. Preferably, region 122 is stacked with substrate 102 and layer 104, that is, the sides of region 122 are in the continuation of sides 112 and 114 of substrate 102 and of layer 104. Regions 122 and 124 may be made of a same electrically-insulating material or be made of different electrically-insulating materials.

Due to the association of a thin substrate and of a conductive layer on the back side of the thin substrate, the device operation is improved with respect to devices which do not have both a thin substrate and a conductive layer on their back side, as described hereafter in the case of the shown example.

In the shown example, substrate 102 is for example P-type doped. An N-type doped area 130 and a P-type area 132, separate from each other, are located on the front surface side of substrate 102. Area 130 and 132 preferably have doping levels (N+, P+) greater than that of substrate 102. Substrate 102 and area 130 form together the PN junction of an avalanche diode.

Preferably, device 100 comprises an insulating layer 140 covering the front side of substrate 102 and located between substrate 102 and sheath 110. In the shown example, layer 140 is crossed by electrically-conductive regions 142, for example, metallic, extending from regions 130 and 132 all the way to terminals 120.

Figure 3:
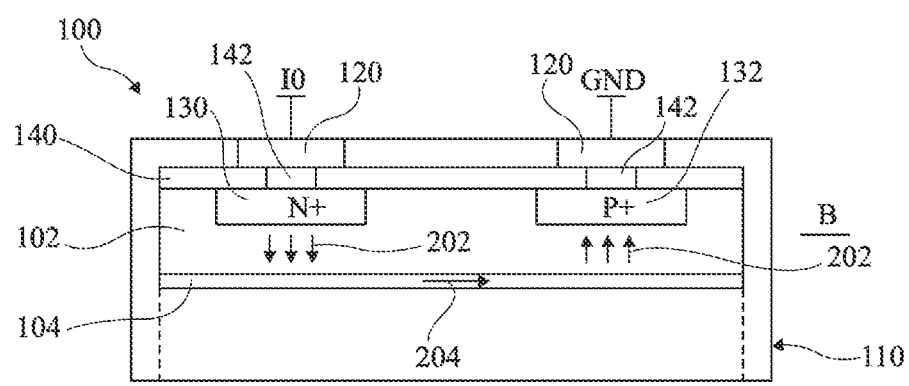
FIG. 3 is a cross-section view schematically showing an example of operation of the device of FIG. 1.

FIG. 3 is a cross-section view illustrating the operation of the example of device 100 shown in FIGS. 1 and 2.

Connection terminals 120 are preferably coupled to a terminal of application of a reference potential, for example, a ground GND, and to a terminal IO to be protected against electrostatic discharges. As an example, N region 130 is coupled, preferably connected, to terminal IO, and P region 132 is coupled, preferably connected, to ground. In case of an electrostatic discharge causing an increase of the potential of terminal IO, the PN junction between doped area 130 and substrate 102 starts an avalanche. A current flows from area 130 to area 132, which carries off the discharge to ground.

Due to the fact that substrate 102 is thin and has its back side covered with electrically-conductive layer 104, the current flows vertically between each of areas 130 and 132 and conductive layer 104 (arrows 202). The current is laterally conducted by metal layer 104 (arrow 204) from above area 130 to above area 132. A uniform distribution of the current coming out of area 130 is obtained. Such a distribution enables to drain off to ground a current having a higher intensity than when the substrate is not thin or has no metal layer under its back side. Indeed, with a non-thin substrate, or with no metal layer, the current would laterally flow between areas 130 and 132 through the substrate. The current would come out of area 130 by concentrating on the side of area 130 close to area 132. Such a concentration would limit the maximum intensity of the current.

The embodiment of FIGS. 1 and 2 is compatible with most electronic chip circuits. Interconnection tracks between the circuit components, such as transistors located inside and on top of substrate 102, may be formed in the insulating layer 140. The circuits are then connected to conductive regions 142 in contact with terminals 120.

FIGS. 4A-7B show, in partial simplified cross-section views, a method of simultaneous forming of a plurality of devices 100 of the type in FIGS. 1 and 2.

Figure 4A:
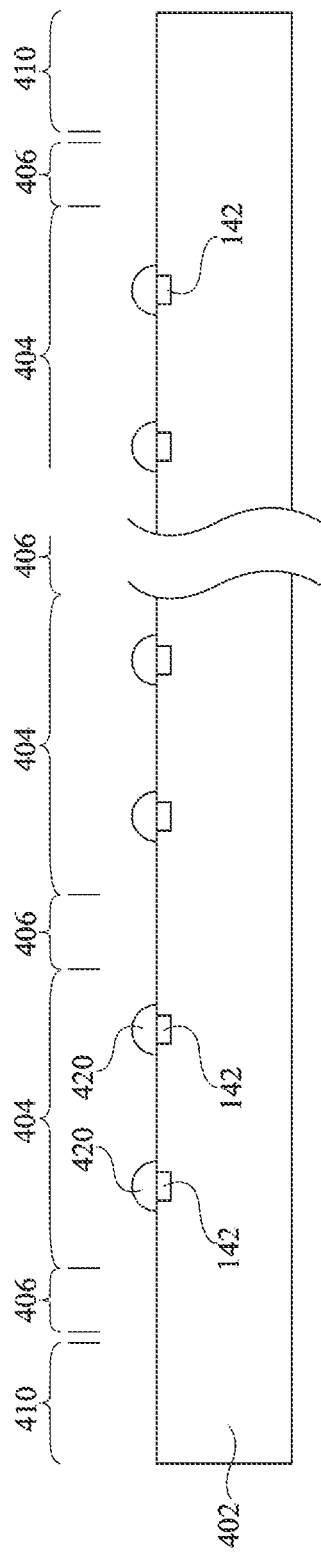
FIGS. 4A-4B show, in partial simplified cross-section views, steps of implementation of a method of simultaneously forming a plurality of devices of FIG. 1.

In FIG. 4A, a semiconductor wafer 402 is provided. Wafer 402 is intended to be divided into individual substrates 102. Each future substrate 102 is located in a portion 404 of wafer 402. In wafer 402, the future substrates 102 are preferably separate, for example, separated and delimited by strips 406. The future substrates 102 are arranged side by side in a central portion of wafer 402, that is, it is provided that a peripheral portion 410 of the wafer corresponds to no substrate 102.

The circuits of the electronic chips, not shown, are formed inside and on top of the future substrates 102. The front surface of wafer 402 has conductive regions 142, connected to the circuits, formed thereon. Regions 142 are preferably accessible from the front side. As an example, regions 142 are located in an insulating layer 140 (FIG. 1, not shown in FIGS. 4A-7B) covering the front side. The insulating layer comprises possible interconnection tracks between the components of the circuits of each chip.

Conductive pads 420, for example, metallic, covering conductive regions 142, are further formed. The future terminals 120 (FIG. 1) will be formed of lower portions of pads 420.

Figure 4B:
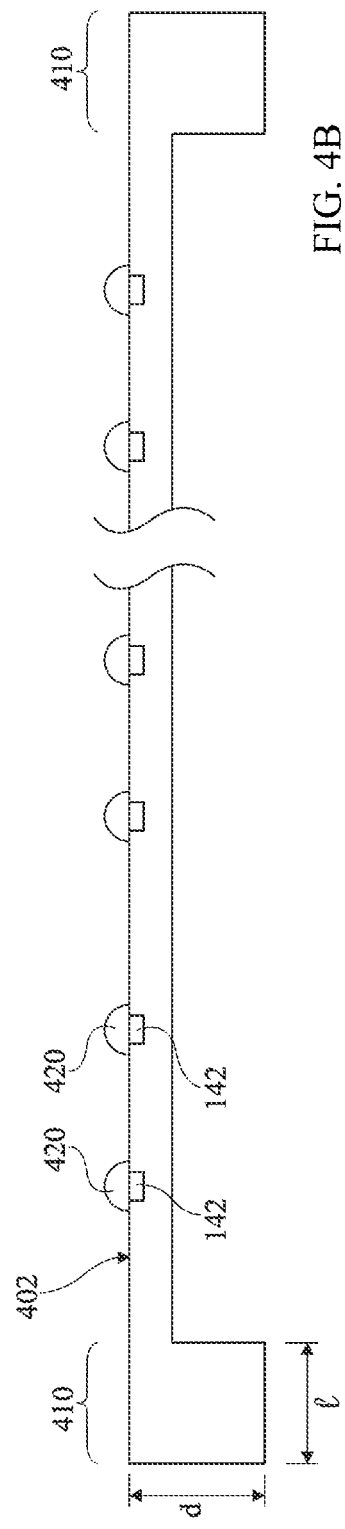

In FIG. 4B, a central portion of the wafer is thinned from the back side of the wafer (corresponding to the back side of the future substrates 102). The central portion includes the future substrates 102. The thinning is preferably implemented after the step of forming the chip circuits. Such a thinning gives the central portion of wafer 402 the thickness of the future substrates 102 which are, as mentioned, preferably thin substrates.

In FIG. 4B, peripheral portion 410 is preferably not thinned, and thus keeps the thickness that wafer 402 had the thinning step. As a variation, peripheral portion 410 is less thinned than the central portion of the wafer. After the thinning step, peripheral portion 410 has a thickness greater than that of the central portion of wafer 402. Preferably, the structure obtained in FIG. 4B has, in peripheral portion 410, a thickness d greater than or equal to approximately 500 µm, for example, 525 µm. Peripheral portion 410 preferably has a width l greater than approximately 2 mm, for example, in the order of 3 mm.

To thus thin the central portion of wafer 402 without thinning peripheral portion 410, a polishing of the type known under trade name "TAIKO" is preferably used. Preferably, to implement such a polishing, a diameter of semiconductor wafer 402 greater than or equal to approximately 20.3 cm (8 inches) is selected. As a variation, any method of removal of the material of a semiconductor wafer from the central portion of its back side, leaving in place the material located at the wafer periphery, may be used.

In FIG. 5A, the back side of the central portion of wafer 402 is covered with a conductive layer 104, preferably metallic. Layer 104 is preferably in contact with wafer 402. Layer 104 preferably has a thickness in the range from 0.5 µm to 5 µm. Preferably, such a thickness is selected according to the electric conductivity of the material of layer 104, and for example according to the intensities of the currents flowing through components such as an avalanche diode. Conductive layer 104 may also cover the peripheral portion 410 of the back side. Layer 104 may be conformal and thus also cover the vertical inner surface of peripheral portion 410.

Due to the fact that peripheral portion 410 has a thickness greater than that of the thinned central region of wafer 402, wafer 402 is more rigid than if the thickness of the wafer was everywhere that of the future thin substrates. This enables to ease the deposition of layer 104 on the back side. In particular, if the thickness of the wafer was always that of the future thin substrates, the wafer would be too flexible to be easily handled.

On the back side of the structure obtained after the forming of layer 104, a layer 522 made of an electrically insulating material is formed. Layer 522 is directly formed on layer 104, in other words, layer 522 is in contact with layer 104. The future regions 122 (FIG. 1) will be portions of layer 522. Preferably, layer 522 is made of a single material. Although a layer 522 comprising a plurality of layers of different materials is possible, a layer made of a single material is simpler to implement. Preferably, the material of layer 522, and thus of regions 122, is a resin, for example, of epoxy type. The thickness of layer 522 is selected so that the total thickness of the structure obtained in FIG. 5A is greater than the thickness of the future devices 100.

Due to the fact that wafer 402 is thicker in its peripheral portion than in its central portion, layer 522 may be formed, for example, by spreading and polymerization of a liquid. In particular, if the wafer thickness was everywhere that of the future thin substrates, the flexibility of the wafer would make it difficult to spread a liquid on the back side. The forming of layer 522 by spreading and polymerization of a liquid is then simpler to implement than, for example, the adding of insulating layer 522 in the form of a rigid support.

In FIG. 5B, from the front side, trenches 530 delimiting substrates 102 are etched. Trenches 530 extend from the front side of substrates 102 to a level located in layer 522. The depth of trenches 530 is preferably greater than or equal to the total height of the relevant substrate 102, of layer 104, and of region 122 (FIG. 1). The trenches do not totally cross layer 522, so that there remains, between the bottom of the trenches and the back side of the structure obtained in FIG. 5B, portions 532 of layer 522. The thickness of regions 532, that is, the distance between the back side of the structure and the bottoms of trenches 530, is sufficient for the structure obtained in FIG. 5B to be easily handled. As an example, the thickness of regions 532 is greater than 150 µm.

Figure 6A:
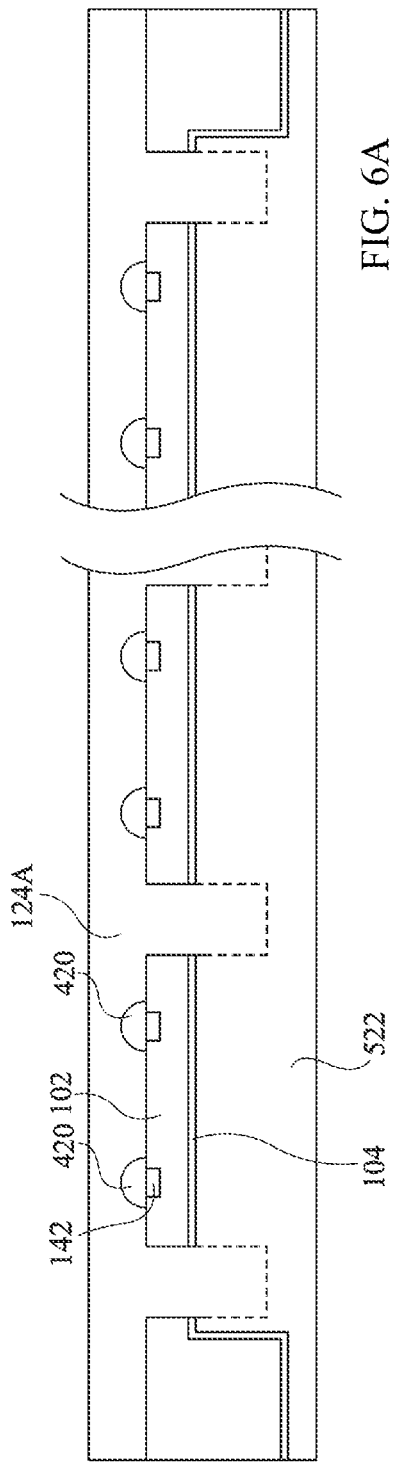
FIGS. 6A-6B show, in partial simplified cross-section views, other steps of implementation of the method of simultaneously forming a plurality of devices of FIG. 1.

In FIG. 6A, the front side of the structure obtained in FIG. 5B is covered with an insulator 124A filling trenches 530. Insulator 124A forms the material of regions 124 of sheath 110 (FIG. 1), for example, insulator 124A is an epoxy-type resin. Preferably, insulator 124A integrally covers the front side. In particular, insulator 124A forms a layer of sufficient thickness for conductive pads 420 to be covered with insulator 124A.

Figure 6B:
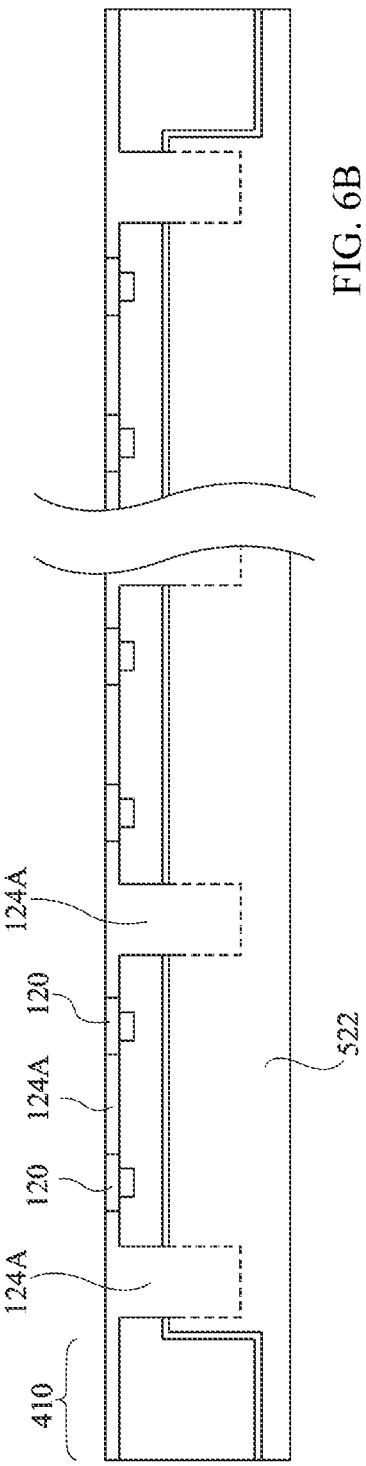

In FIG. 6B, all the elements of the structure obtained in FIG. 6A located on the front side are removed above a level running through metal pads 420. Such a removal is for example performed by chemical-mechanical (chem.-mech.) polishing. This results in connections pads 120 corresponding to the remaining portions of pads 420. Thus, insulator 124A covers the front side of substrates 102 except for the locations of terminals 120. Terminals 120 are flush with the upper surface of insulator 124A.

Figure 7A:
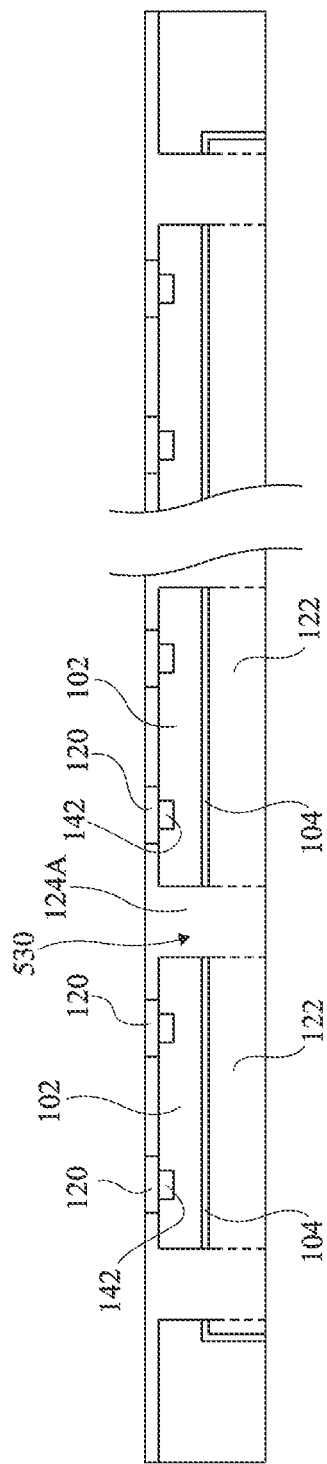
FIGS. 7A-7B show, in partial simplified cross-section views, other steps of implementation of the method of simultaneously forming a plurality of devices of FIG. 1.

In FIG. 7A, the back side of the structure obtained in FIG. 6B is polished. Preferably, the polishing completely removes regions 532 of layer 522. Regions 122 of sheaths 110 have thus been delimited in layer 522. After this step, the substrates 102, the conductive layers 104, and the insulating regions 122 of devices 100 have thus been formed. In the preferred case of a layer 522 made of a single material, the back side of layer 104 is only covered with this material.

Devices 100 are coupled together by insulator 124A located in trenches 530, due to the adherence of insulator 124A on the sides of substrates 102, of conductive layers 104, and of regions 122. The thickness of the structure obtained in FIG. 7A can thus be selected so that all the devices 100 coupled together forms a plate easy to handle.

Figure 7B:
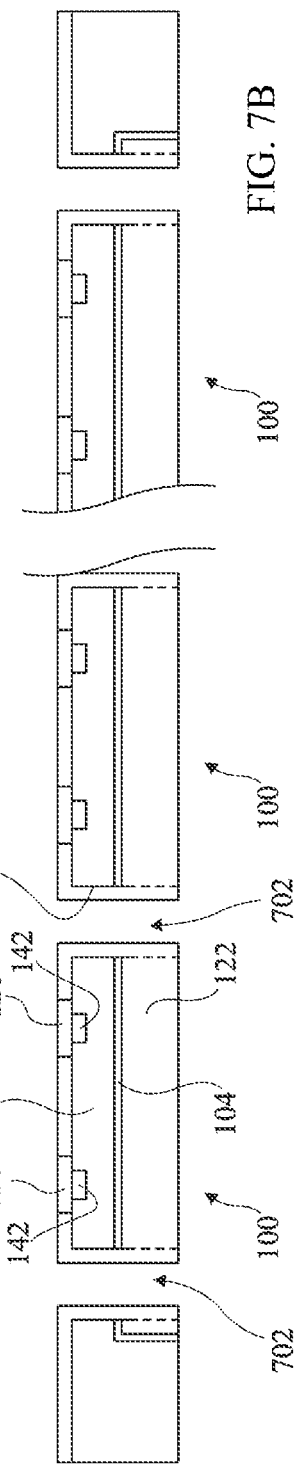

In FIG. 7B, the structure obtained in FIG. 7A is cut into individual devices 100. To achieve this, insulator 124A is removed from portions 702 along the entire height of the structure, for example, by cutting. Regions 702 are located in strips 704 and have a width smaller than that of trenches 530, so that portions of insulator 124A covering the sides of substrates 102, of conductive layers 140, and of regions 122 are left in place in each device 100. The region 124 of each sheath 110 comprises the portions of insulator 124A covering the front side and the sides of substrate 102, of layer 104, and of the relevant region 122. Region 124 is flush with the back side of region 122 around region 122.

Due to the fact that the region 122 which is in contact with layer 104 is electrically insulating, layer 104 is electrically insulated on the back side without needing to adjust an additional electrically-insulating layer on the back side of the structure obtained in FIG. 7A or on the back sides of the devices 100 obtained in FIG. 7B. A step of forming this additional layer is thus avoided, and the method is thus simplified as compared with a method comprising the forming of such an additional insulating layer.

Further, due to the fact that there is no such additional insulating layer, the thickness of the devices 100 obtained in FIG. 7B is the same as that of the structure obtained in FIG. 7A. Accordingly, the obtained devices 100 have a decreased thickness as compared with devices where the insulating sheath would be formed, on the back side, of a portion of an additional insulating layer covering a region in contact with the back side of layer 104.

Various embodiments and variations have been described. It will be understood by those skilled in the art that certain characteristics of these various embodiments and variations may be combined, and other variations will occur to those skilled in the art.

Finally, the practical implementation of the described embodiments and variations is within the abilities of those skilled in the art based on the functional indications given hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a semiconductor substrate having a first surface and a second surface opposite to one another, the semiconductor substrate including a first region doped with a first conductivity type and a second region doped with a second conductivity type on the second surface;
    a first conductive structure in contact with the first region and a second conductive structure in contact with the second region;
    an electrically-conductive layer covering the first surface of the substrate, the electrically-conductive layer being electrically separated from any conductive structure, including the first conductive structure and the second conductive structure, on the second surface of the semiconductor substrate by the semiconductor substrate; and
    an electrically insulating sheath enveloping the substrate and electrically-conductive layer, and in direct contact with a side surface of the conductive layer that is opposite to the substrate.

2. The device of claim 1, wherein the insulating sheath includes an insulating layer of a single insulating material that covers the side of the conductive layer that is opposite to the substrate.

3. The device of claim 1, comprising electronic components located inside and on top of the substrate.

4. The device of claim 3, wherein the electronic components are located on the second surface of the substrate opposite to the conductive layer.

5. The device of claim 1, wherein the conductive layer is metallic.

6. The device of claim 1, wherein the substrate comprises a doped area defining an electrode of an avalanche diode.

7. The device of claim 1, wherein the sheath defines a CSP-type package.

8. A method, comprising:
    forming an electrically-conductive layer covering a first surface of a semiconductor substrate, the semiconductor substrate including a first region doped with a first conductivity type and a second region doped with a second conductivity type on a second surface of the semiconductor substrate opposite to the first surface;
    forming a first conductive structure in contact with the first region and a second conductive structure in contact with the second region, the semiconductor substrate electrically separating the electrically-conductive layer from any conductive structure, including the first conductive structure and the second conductive structure, on the second surface of the semiconductor substrate; and
    forming an electrically insulating sheath enveloping the substrate and the electrically-conductive layer, the insulating sheath being in direct contact with a side surface of the electrically-conductive layer that is opposite to the substrate.

9. The method of claim 8, wherein the forming the electrically-conductive layer includes simultaneously forming an electrically-conductive layer on each of a plurality of semiconductor substrates that are positioned on a carrier substrate.

10. The method of claim 9, further comprising forming the plurality of semiconductor substrates from portions of a central portion of a same semiconductor wafer.

11. The method of claim 10, comprising thinning the central portion while keeping a thickness of a peripheral portion of the semiconductor wafer.

12. The method of claim 10, comprising forming, on a back side of the semiconductor wafer, a conductive layer.

13. The method of claim 12, comprising forming an insulating layer of insulating material covering the conductive layer.

14. The method of claim 13, comprising forming trenches delimiting the plurality of semiconductor substrates.

15. The method of claim 14, comprising filling the trenches with an insulating material.

16. A packaged device, comprising:
    a semiconductor substrate;
    electronic circuitry formed in the semiconductor substrate, the electronic circuitry including a first region doped with a first conductivity type and a second region doped with a second conductivity type on a first face of the semiconductor substrate;
    an electrically-conductive layer covering a second face of the semiconductor substrate that is opposite to the first face;
    an electrically insulating sheath enveloping the substrate and electrically-conductive layer, the insulating sheath being in direct contact with a surface of the electrically-conductive layer that is opposite to the semiconductor substrate; and conductive contacts extending through the insulating sheath and being electrically coupled to the first region and the second region of the electronic circuitry, wherein the conductive contacts are electrically separated from the electrically-conductive layer by the semiconductor substrate.

17. The packaged device of claim 16, wherein the insulating sheath includes an insulating layer of a single insulating material that covers a side of the conductive layer that is opposite to the semiconductor substrate.

18. The packaged device of claim 16, wherein the electronic circuitry is located at a side of the semiconductor substrate opposite to the conductive layer.

19. The packaged device of claim 16, wherein the electronic circuitry includes an avalanche diode that includes a doped area of first conductivity type within the substrate which is of the second conductivity type.

20. The packaged device of claim 16, wherein the insulating sheath completely covers all sides of the semiconductor substrate except for the conductive contacts extending through the insulating sheath.

\* \* \* \* \*